United States Patent
Vogel et al.

(10) Patent No.: US 7,626,207 B2
(45) Date of Patent: Dec. 1, 2009

(54) INTEGRATED OPTOCOUPLER WITH ORGANIC LIGHT EMITTER AND INORGANIC PHOTODETECTOR

(75) Inventors: Uwe Vogel, Dresden (DE); Joerg Amelung, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 291 days.

(21) Appl. No.: 11/840,266

(22) Filed: Aug. 17, 2007

(65) Prior Publication Data

US 2008/0054275 A1 Mar. 6, 2008

(30) Foreign Application Priority Data

Aug. 31, 2006 (DE) .................. 10 2006 040 788

(51) Int. Cl.
*H01L 27/142* (2006.01)
(52) U.S. Cl. .................. 257/82; 257/80; 257/81; 257/E51.018
(58) Field of Classification Search ............. 257/80–82, 257/E51.018
See application file for complete search history.

(56) References Cited

U.S. PATENT DOCUMENTS

| | | | |
|---|---|---|---|
| 5,637,907 A * | 6/1997 | Leedy | .................. 257/434 |
| 6,838,301 B2 | 1/2005 | Zheng et al. | |
| 7,342,258 B2 * | 3/2008 | Yamazaki et al. | ............. 257/82 |
| 2002/0066904 A1 | 6/2002 | Yuan et al. | |
| 2009/0129724 A1 * | 5/2009 | Carter et al. | .................. 385/14 |
| 2009/0134309 A1 * | 5/2009 | Leo et al. | ................. 250/201.1 |

FOREIGN PATENT DOCUMENTS

| | | |
|---|---|---|
| DE | 100 61 298 A1 | 6/2002 |
| DE | 101 03 022 A1 | 8/2002 |
| DE | 101 54 906 A1 | 5/2003 |
| EP | 0 488 141 A2 | 6/1992 |
| EP | 1 043 780 A1 | 10/2000 |
| EP | 1 246 260 A2 | 10/2002 |

OTHER PUBLICATIONS

Vogel et al., "Reflex Coupler With Integrated Organic Light Emitter", U.S. Appl. No. 11/847,472, filed Aug. 30, 2007.
English abstract of EP 1246260, Kind Code: A1, Published on Oct. 2, 2002.
English Abstract of DE 10154906, Kind Code: A1, Published on May 28, 2003.
English Abstract of DE 10061298, Kind Code: A1, Published on Jun. 27, 2002.

* cited by examiner

*Primary Examiner*—Allan R. Wilson
(74) *Attorney, Agent, or Firm*—Keating & Bennett, LLP

(57) ABSTRACT

An optocoupler has an organic light emitter and an inorganic photodetector with a detector area, the detector area being optically coupled to the organic light emitter. The organic light emitter converts an electrical input signal into a light signal and the inorganic photodetector converts the light signal into an electrical output signal, the organic light emitter and the inorganic photodetector being integrated in a component and galvanically separated.

16 Claims, 4 Drawing Sheets

INTEGRATED OPTOCOUPLER WITH ORGANIC LIGHT EMITTER AND INORGANIC PHOTODETECTOR

CROSS-REFERENCE TO RELATED APPLICATION

This application claims priority from German Patent Application No. 10 2006 040 788.1, which was filed on Aug. 31, 2006, and is incorporated herein by reference in its entirety.

BACKGROUND OF THE INVENTION

1. Field of the Invention

The present invention refers to an integrated optocoupler with an organic light emitter and an inorganic photodetector, and in particular to a monolithically integrated CMOS optocoupler with an OLED light source.

2. Description of the Related Art

Optocouplers have been widely spread as technical means for galvanic isolation and/or electrical potential separation. This includes applications in car industry, consumer electronics, medical and measuring technology, data communication and the like. Optocouplers are used for electrical isolation of an input signal from a corresponding output signal and can be used as a substitution for relays and Reed relays (protective glass relays). They are advantageous because of their fast switching speed, higher reliability, better electrical isolation and, compared to conventional relays, drawbacks due to mechanical bonding and/or switching (so-called bounce effects) are avoided.

An optocoupler has a light emitter and a light receiver, which are optically coupled through a coupling medium and/or a light guide. Light-emitting diodes (LED), which emit e.g. infra-red light or red light, are often used as light emitters. Photodiodes, phototransistors, photothyristors, phototriacs, photo-Schmitt-triggers or photo-Darlington-transistors are e.g. used as light receivers. Light emitters and light receivers are connected to each other through an electrically non-conductive insulator.

The electrical isolation of circuit parts is necessary for potential separation, but also in order to avoid parasitic reactions. Potential separation is inter alia advantageous as a protection against hazards in medical appliances, but also in data communication (network/interface card) or as over-voltage protection. Parasitic reactions, which one would like to suppress with optocouplers, are for example noise in small signals or transients in engine control. Binary or analogue signals are transmitted in optocouplers.

An optocoupler is shown schematically in FIG. 10, a light emitter 20 converting an electrical signal, which is present at the input 10, into an optical signal 40. The optical signal 40 is transmitted from an optical outlet area 25, by means of a light guide 30, to an optical inlet area 55 of a light receiver 50. The light receiver 50 re-converts the optical signal 40 into an electrical output signal, which is present at an output 60. For potential separation, it is important that the light guide 30 electrically isolates the light emitter 20 from the light receiver 50, i.e. that the light guide 30 has a transparent dielectric material.

The market for optocouplers can be divided into two different main areas, on the one hand the simple optocoupler based on the classical photodiode and/or photo- (Darlington) transistor, on the other hand the fully integrated optocouplers with a CMOS read circuit (CMOS=Complementary Metal Oxide Semiconductor) for higher functions.

Photodiodes as possible light receivers and/or photodetectors 50 can be reproduced during a standard CMOS process at different p-n interfaces and FIG. 9 shows an example in an n-well CMOS process according to the state of the art. Formed in a p-doped substrate (p-type substrate) 910 is an n-doped well (n-well) 920, which has a $p^+$-doped layer 930 on the side opposite the p-type substrate 910. As a final layer for the photodetector 50, the p-type substrate 910 has an oxide layer 940, which is followed by usual CMOS layers, such as e.g. an ILD layer 950 (ILD=Inter Layer Dielectric) and a IMD layer 960 (IMD=Inter Metal Dielectric). The oxide layer 940, the ILD layer 950 and the IMD layer 960 have a dielectric material and are translucent. Several p-n junctions are designated in FIG. 9 by diodes 925, 935 and 975.

Incident light beams 990 generate in the n-well 920 a pair of load carriers 985 of opposite loaded polarity, which is separated according to the polarity and causes an electrical signal. The photodetector 50 is comprised of the layers: p-type substrate 910, n-well 920, $p^+$-doped layer 930. FIG. 9 shows furthermore a photodiode 975, which is comprised of a p-n junction of p-type substrate 910 and an $n^+$-doped surface layer 970. The light signals 980 represent e.g. light reflected at the surface layer 970.

Known fully integrated optocouplers are based on a CMOS-based receiving and evaluating chip, as well as on an emitter (light emitter) 20 comprised of conventional (inorganic) light-emitting diodes (i.e. conventional LEDs), which have typically an optically close connection with the photodiode and/or with the photodetector 50. These two technologies use materials and processes that differ from each other. The standard CMOS process is mostly based on single-crystal silicon material, while conventional light-emitting diodes mostly use single-crystal III-V semiconductors. Therefore, the elements photodetector 50 and light-emitting diode as light emitter 20 cannot be produced monolithically, but can exclusively be integrated in a hybrid way with each other.

Conventional light-emitting diodes comprised of inorganic semiconductors, such as e.g. GaAs and related III-V semiconductors have been known for decades. The basic principle of such light-emitting diodes is that by applying an electric voltage electrons and holes are injected into a semiconductor and combine through radiation in a recombination zone during light emission.

As an alternative to inorganic light-emitting diodes, light-emitting diodes based on organic semiconductors have in recent years achieved large progresses. For example, an organic electroluminescence presently experiences great attention as a medium suitable for displays. Organic light-emitting diodes have a series of organic layers with a thickness typically in the range of 100 nm, which is inserted between an anode and a cathode. Glass is often used as a substrate, on which a transparent electrically conductive oxide, such as e.g. indium-tin oxide (ITO=Indium-Tin Oxide), is applied. Then follows the series of organic layers, which has hole-transporting material, emitting material and electron-transporting material. A metallic cathode usually follows then.

FIG. 8 shows organic light-emitting diodes (OLED) according to the state of the art, at the left being shown a so-called bottom emitter 810 and at the right a so-called top emitter 820.

In the case of the bottom emitter 810, a transparent electrode 814, a series of organic layers 816 and a second electrode 818 are deposited on a substrate 812. The transparent electrode 814 is electrically connected through a first contact 815 and the second electrode 818 through a second contact 819. In the series of organic layers 816, an electric signal at the first contact 815 and the second contact 819 is converted into a light signal 40 which is radiated mainly downward in the representation shown here.

As already mentioned above, the following materials can be used. For the transparent electrode 814, e.g. ITO can be used, while for the second electrode 818 a metal is often used and the series of organic layers 816 has e.g. a hole-transporting material, an emitting material and an electron-transporting material. An upward radiation is prevented in the case of the bottom emitter 810 in that the second electrode 818 has an opaque material. In order for the substrate 812 not to prevent light propagation, glass is typically used as transparent material.

The top emitter 820, which is represented at the right side in FIG. 8, has an accordingly reversed series of layers. The second electrode 818 which has an opaque material is deposited on a substrate 822. Then follows the series of organic layers 816, followed by the transparent electrode 814, which has a transparent material (e.g. ITO). The transparent electrode 814 is, in turn, electrically connected through the first contact 815 and the second electrode 818 through the second contact 819. In this case too, an electrical signal at the first contact 815 and the second contact 819 is converted in the series of organic layers 816 into a light signal 40, which because of the opacity of the second electrode 818 is mainly radiated upward in the representation shown.

Irrespective of the selected representation, the bottom emitter 810 radiates the light signal 40 mainly through the substrate 812, while the top emitter 820 radiates in a direction away from the substrate 822. The light signal 40 in FIG. 8 indicates a main radiation direction. The light generated in the series of organic layers 816 however also propagates along the series of organic layers 816 or along the transparent electrode 814 and, if no lateral protection is present, is also partly radiated sidewise.

Optocouplers with an integration of both inorganic emitters (i.e. the light emitter 20), which are usually based on III-V semiconductors, and inorganic detectors (i.e. the photodetector 50), such as e.g. CMOS photodiodes are known. Optocouplers with the integration of both organic emitters and organic detectors are also known, which are described for example in DE 10061298 A1 or DE 10103022 A1. Furthermore, photodetectors for picture recorders are known, which are implemented in a silicon handle wafer of an SOI substrate (SOI=Silicon On Insulator) (inter alia U.S. Pat. No. 6,838, 301 B2).

Since conventional LEDS, as has been said, primarily use III-V semiconductors and the detector circuit (i.e. the photodetector 50 and the activating circuit) is mostly based on silicon, both elements cannot be produced on the same substrate and an integration therefore proves difficult. A possible hybrid integration in optocouplers, such as known for example from the state of the art, necessitates in principle a higher manufacturing cost and, as a matter of fact, does not allow a general price regression with large numbers of units. Furthermore, because of the hybrid structure, the necessary reliability for car applications can be achieved only at an extremely high cost.

SUMMARY OF THE INVENTION

According to an embodiment, an optocoupler may have: an organic light emitter, and an inorganic photodetector having a detector area, the detector area being optically coupled with the organic light emitter, one or several shielding planes arranged above each other and separated by isolating layers arranged substantially parallel to a light-emitting surface of the organic light emitter between the photodetector and the OLED, the organic light emitter converting an electrical input signal into a light signal and the inorganic photodetector converting the light signal into an electrical output signal, and the organic light emitter and the inorganic photodetector being integrated in a component, wherein the shielding planes cause a light shielding and a focusing of the light signal and are electrically isolated from the light-emitting surface.

Embodiments of the present invention are based on the finding that an integrated optocoupler can be created on a substrate by using an organic light emitter and an inorganic photodetector. An organic light emitter and an inorganic photodetector can have a conventional structure and are integrated in a component. For example, the monolithic integration of the light source and/or the light emitter and the photodetector on a chip becomes possible through integrating an OLED emitter as post-processing on a highly structured CMOS substrate. The structures of the CMOS construction can simultaneously serve as an electrical insulator and a light guide. Photodiodes forming at p-n stop layers and inherent to CMOS or similar elements can be used as a photodetector.

OLEDs are in particular favourable, since they permit a high integration during a production of optocouplers and can, in addition, be deposited on almost any substrates and can thus, in particular, also be integrated directly on a silicon substrate. Furthermore, a deposition can occur at relatively low temperatures (for example below 100° C.). Thus, OLEDs can be deposited on a normal CMOS/BiCMOS circuit (BiC-MOS=Bipolar Complementary Metal Oxide Semiconductor), without any risk of damages. An isolation oxide or an isolation layer present on an integrated circuit (CMOS structure) can simultaneously create an optical connection, i.e. serve as a light guide, whereby a desired electrical isolation value can be adjusted by means of a layer thickness of the isolation layer. Thus, this technology becomes very simple.

The integration of OLEDs in CMOS structures can occur as follows. OLEDs as top emitters can use for example a usual CMOS metal layer as an electrode, on which the series of organic layers is deposited and a transparent electrode is applied. A concrete exemplary embodiment is described more in detail below.

An OLED as bottom emitter can for example be applied on a usual CMOS oxide layer (e.g. an IMD layer), a transparent electrode being in this case deposited on the usual CMOS oxide layer, which serves as a substrate. A usual CMOS metal layer can, here too, serve as the second electrode, the series of organic layers being deposited as intermediate layer. The OLED as bottom emitter radiates directly on the photodetector under it, which can be made for example in the form of p-n stop layers inherent to CMOS. Typical transparent conductive materials for the transparent electrode are indium-tin oxide (ITO) or zinc oxide (ZnO) or other conductive oxides. A concrete embodiment is explained more in detail below.

The light emitter and the light receiver have, according to an embodiment of the invention, an "optical proximity" and thus a necessary OLED area can be reduced and a current consumption can be kept low. The production is thus economical. Through an appropriate choice of a wavelength used of the light signal generated (which is substantially determined by the material used), can be achieved as low an absorption as possible of the light guide, which results in an optimized optical signal transmission. In order to maintain a necessary OLED voltage as low as possible, the series of organic layers can have a doped transport layer and a reduced input-voltage threshold can thus be achieved.

The deposition of the OLED is thus technologically fully compatible with the CMOS/BiCMOS as well as the bipolar technology and thus allows manufacturing integrated OLED optocouplers. A production is even possible without any problem and at low cost on large substrates (e.g. up to 200× 200 mm).

With the OLED technology, i.e. using OLEDs as light emitters, there is provided for the first time the possibility of a monolithically integrated solution for optocouplers, i.e. of performing light generation and detection on one substrate (e.g. on a silicon substrate). They thus offer advantages as regards the size of the components as wells as regards the possibility of integrating new functions, i.e. they are can be easily and highly integrated. In addition, they exhibit high efficiency at varying insulation resistances and have low power consumption.

Further advantages of the organic electroluminescence are that because of the chemical variability OLEDs can be produced in almost all colours and that because of the deposition at low temperatures OLEDs can be applied on the most diverse substrates. Therefore, multi-channel solutions, for example through the use of OLEDs emitting light of different colour or wavelength, can be integrated on a chip.

The advantages of the optocouplers with integrated OLEDs, compared with well-known hybrid solutions, can be summarized as follows. The complexity of the construction and connection technique (CCT) for the integration is reduced and the costs are reduced. In addition, the monolithic integration of light source, electrical insulator, light guide and photodetector on a chip can easily be implemented. Furthermore, standard CMOS layers/structures can be used as electrical insulator and light guide. This results into an improvement of the isolation strength when using a SOI-CMOS substrate and a reduction of the chip area. Finally, the exemplary embodiments of the present invention provide the possibility of a complex integration of an activation circuit for the light emitter and electronic reading unit for the photodetector.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

Exemplary embodiments of the present invention will now be described more in detail, with reference to the attached drawings, in which.

DETAILED DESCRIPTION OF PREFERRED EMBODIMENTS

Figure 1:
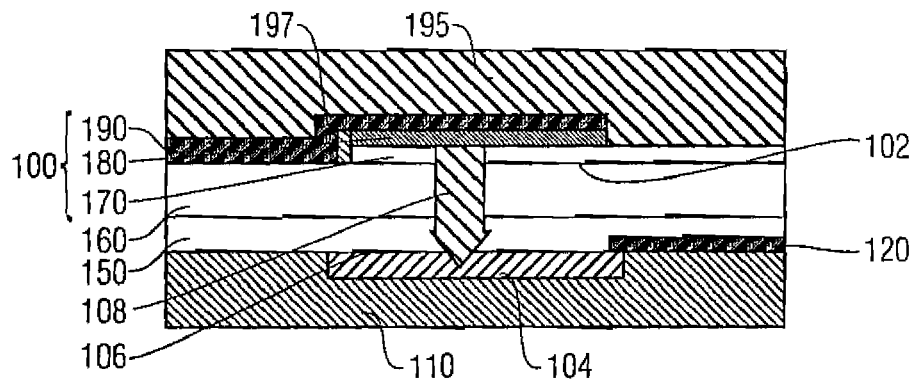
FIG. 1 shows an OLED as a bottom emitter radiating directly onto a photodetector.

Before describing the present invention more in detail hereafter with reference to the drawings, the attention is drawn on the fact that same elements in the figures are designated by same or similar reference numerals, and that a repeated description of these elements is omitted.

FIG. 1 shows an OLED 100 as a bottom emitter, which has a light-emitting surface 102 and radiates directly onto the photodetector 104 located under it, which is for example part of a CMOS structure. The photodetector 104 is embedded in a substrate 110, is connected through a contact 120 and shielded by an ILD layer 150 of the CMOS structure. An IMD layer 160 of the CMOS structure serves as a basis or substrate for the OLED 100, i.e. on the IMD layer 160 are deposited a transparent electrode 170, a series of organic layers 180 and a second electrode 190. A passivation or protective layer 195 serves as finishing layer and a side passivation 197 isolates the transparent electrode 170 from the second electrode 190.

Figure 9:
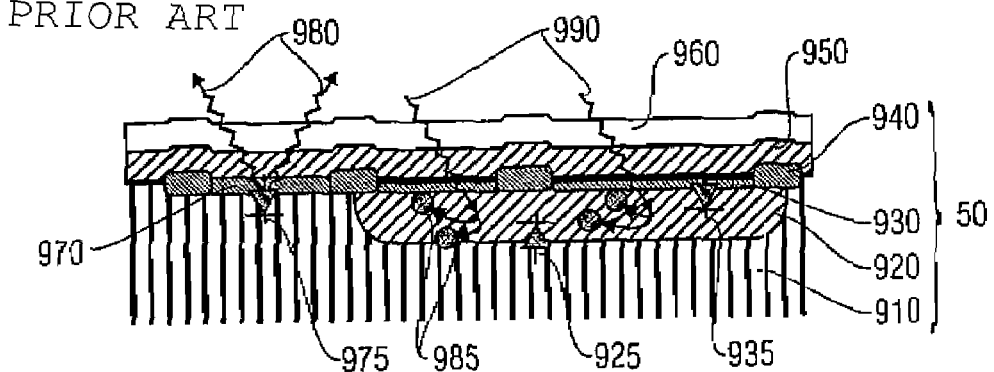
FIG. 9 shows photodiodes in the standard n-well CMOS process.
Figure 10:
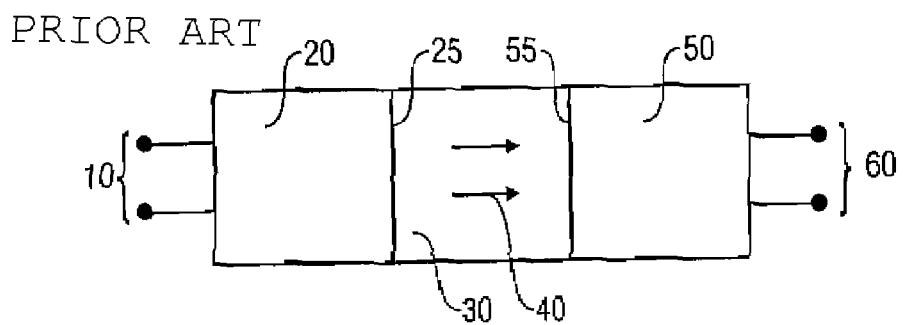
FIG. 10 shows a schematic construction of an optocoupler.

The OLED as bottom emitter 100 converts an electrical signal into a light signal 108 which passes, through the IMD layer 160 and then through the ILD layer 150, to the photodetector 104 and is re-converted there into an electrical output signal. The photodetector 104 can be designed as an arbitrary photo-sensitive element present in CMOS structures, for example as a photodiode (see FIG. 9) or as a phototransistor or the like. Further contacts necessary for the photodetector 104 are not shown in FIG. 1, for clarity reasons.

Figure 2:
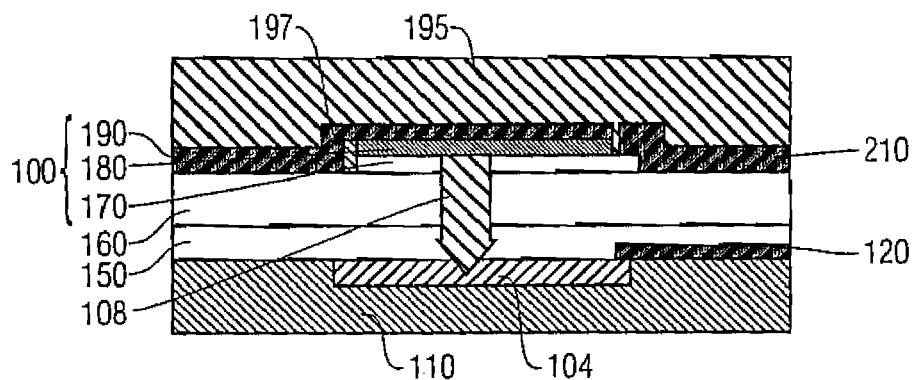
FIG. 2 shows an OLED as a bottom emitter radiating directly onto a photodetector, with side shielding.

FIG. 2 shows another exemplary embodiment of the present invention, which has an additional side shielding 210. The shielding can be formed by a metal guiding plane of the CMOS structure and furthermore serve for the electrical connection of the transparent electrode 170.

Like in the exemplary embodiment of FIG. 1, the photodetector 104 is embedded in the substrate 110 and is electrically connected by the electrode 120. The light emitter is, here too, an OLED 100 as bottom emitter with the transparent electrode 170, the series of organic layers 180 and the second electrode 190 which is embedded in the passivation layer 195. The side passivation layer 197 provides an isolation between the transparent electrode 170 and the second electrode 190. Between the light emitter 100 and the photodetector 104, the IMD layer is, here too, arranged on the side of the photodetector 104 and the ILD layer on the side of the light emitter 100.

The shielding layer 210, which laterally surrounds the transparent electrode 170, is advantageous for reducing parasitic effects due to light-guide effects in the transparent electrode 170. It suppresses for example the above-mentioned side radiation. The shielding layer 210, which has for example a metallic material, the ILD layer 150 and the IMD layer 160 can, here too, be possible inherent parts of the CMOS structure.

Figure 3:
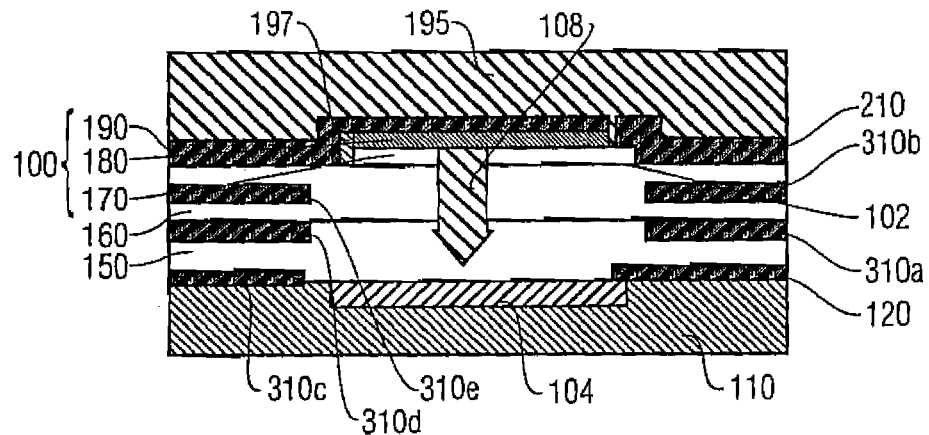
FIG. 3 shows an OLED as a bottom emitter radiating directly onto a photodetector, with side shielding and additional light guiding.

FIG. 3 shows an exemplary embodiment in which, in addition to the layers which the structure of FIG. 2 is comprised of, further shielding planes 310a, 310b, 310c, 310d, 310e are incorporated between the photodetector 104 and the OLED 100. The shielding planes 310a and 310d are embedded in the IMD layer 150, while the shielding planes 310b and 310e are embedded in the ILD layer 160. Finally, the shielding plane 310c is deposited at an interface between the IMD layer 150 and the p-type substrate 110. A new description of the elements already described in FIG. 2 is omitted here. The shielding planes $310a$, $310b$, $310c$, $310d$ and $310e$ in this exemplary embodiment can be e.g. additional metal guiding planes of the CMOS structure and serve as additional light shielding and focusing of the light signal 108 and, therefore, support a detection of the light signal 108 by the photodetector 104. Besides their function as a shielding layer, some of the metal guiding planes can furthermore serve for the electrical connection of elements of the optocoupler according to the invention.

Figure 4:
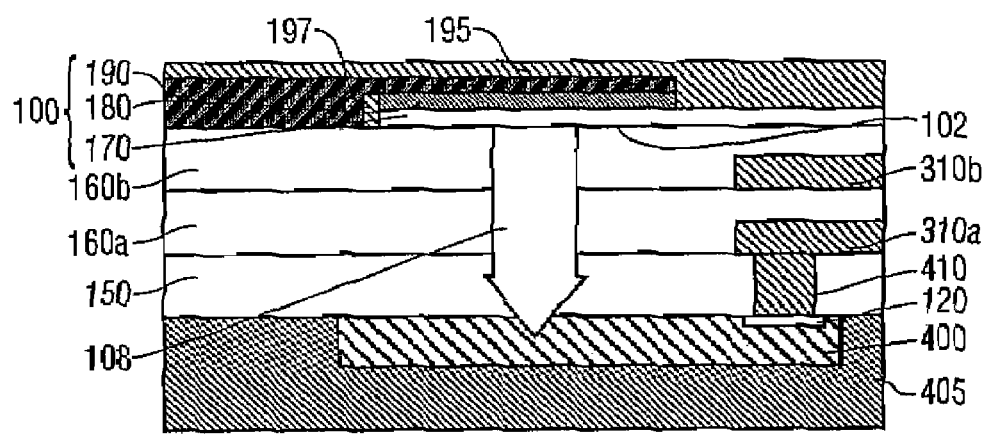
FIG. 4 shows an OLED as a bottom emitter radiating directly onto a photodetector, with a photodiode as photodetector.

FIG. 4 shows an exemplary embodiment in which a photodetector has a photodiode 400, which can be formed e.g. by a p-n junction of a n-well to the substrate 405 or to a p$^+$-doped surface layer (or also uses another existing p-n junction). The photodiode 400 is connected through the contact 120 and is embedded in the p-type substrate 405. Further necessary contacts of the photodetector are not shown, for simplicity's reasons. Between the photodetector 400 and the OLED 100 are arranged, in this exemplary embodiment, the ILD layer 150, followed by an IMD1 layer $160a$ and an IMD2 layer $160b$. The IMD1 layer $160a$ has a shielding plane $310a$ and the IMD2 layer $160b$ has a shielding plane $310b$. The OLED 100 has, here too, the transparent electrode 170, which is deposited on the IMD2 layer $160b$, the series of organic layers 180 and the second electrode 190 and is protected by the passivation layer 195. The side passivation 197 provides, here too, an isolation between the transparent electrode 170 and the second electrode 190.

The contact 120 is connected to the shielding plane $310a$ through a bridge and/or a through-connection 410 which bridges the ILD layer 150. The metal guiding plane, which provides the shielding plane $310b$, thus serves furthermore for electrically connecting the contact 120. The ILD layer 150 serves, here too, as a protection for the photodiode 400 and the p-type substrate 910. Like before also, the ILD layer 150, the IMD1 layer $160a$ and the IMD2 layer $160b$ can also be part of a CMOS structure and the shielding planes $310a$ and $310b$ can for example be implemented by metal guiding planes of the CMOS structure.

The OLED as a bottom emitter 100 generates from an electrical input signal the light signal 108 which passes through the IMD2 layer $160b$, the IMD1 layer $160a$ and finally the ILD layer 150, before it enters into the photodiode 400 and generates an electrical output signal there.

Figure 5:
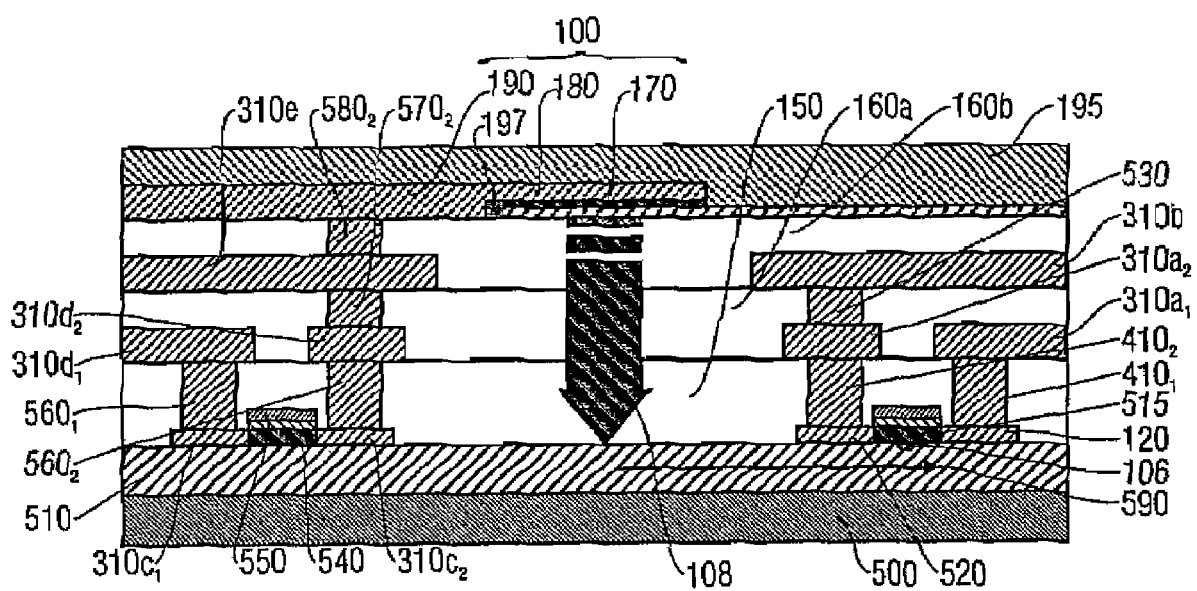
FIG. 5 shows an OLED as a bottom emitter radiating indirectly onto a photodetector.

FIG. 5 shows an exemplary embodiment, in which the OLED 100 radiates indirectly onto a photodetector 515 using a buried dielectric transparent layer 510, which serves as a light guide. The dielectric transparent layer 510 (which can be called buried layer) is deposited on a substrate 500 and serves as a basis for the photodetector 515 and an OLED driver transistor 540. The photodetector 515 and the OLED driver transistor 540 are embedded in the ILD layer 150 and on the ILD layer 150 are deposited the IMD1 layer $160a$ and the IMD2 layer $160b$. The IMD2 layer serves furthermore as a substrate for the following OLED 100 with the transparent electrode 170, the series of organic layers 180 and the second electrode 190, which are also embedded in a passivation layer 195 and the side passivation 197 provides isolation between the transparent electrode 170 and the second electrode 190.

The photodetector 515 is electrically connected through the contact 120 and a contact 520. The contact 120 is connected through a first bridge $410_1$ to a first portion $310a_1$ of the shielding plane $310a$. The contact 520 is connected through a second bridge $410_2$ to a second portion $310a_2$ of the shielding plane $310a$ and the second portion $310a_2$ is, in turn, connected through a third bridge 530 to the shielding plane $310b$. An electrical connection of the OLED driver transistor 540 occurs through a first portion $310c_1$ and a second portion $310c_2$ of the shielding plane $310c$. The first portion $310c_1$ is connected through a fifth bridge $560_1$ to a first portion $310d_1$ of the shielding plane $310d$. The second portion $310c_2$ is connected through a sixth bridge $560_2$ to a second portion $310d_2$ of the shielding plane $310d$. The second portion $310d_2$ is, in turn, connected through a seventh bridge $570_2$ to the shielding plane $310e$, which is, in turn, electrically connected through an eighth bridge $580_2$ to the second electrode 190 of the OLED 100.

As described before, the shielding planes $310b$ and $310e$ are embedded in the IMD2 layer $160b$ and the shielding planes $310a$ and $310d$ in the IMD1 layer $160a$. On the other hand, the ILD layer 150 has the portions $310c_1$ and $310c_2$ of the shielding plane $310c$ as well as the contacts 120 and 520. The structures designated as shielding planes are each implemented by sections of the metal guiding planes of a CMOS structure and serve furthermore, through respective bridges or through-connections, at least partly as connecting structures.

In this exemplary embodiment, the light signal 108 which is emitted by the OLED 100 as bottom emitter, does not arrive directly on the photodetector 515, but on the incorporated dielectric transparent layer 510, which serves as light guide. The light signal 108 generates in the dielectric transparent layer 510 a light signal 590 which propagates toward the photodetector 515 and generates there an electrical signal which is output through the contacts 120 and 520. As described above, the contact 120 is connected to the first portion $310a_1$ of the shielding plane $310a_1$ and the contact 520 is connected to the shielding plane $310b$, where the electrical signal is present as output signal.

It is advantageous to use for the portions of the shielding planes $310a_1$, $310a_2$, $310b$, $310c_1$, $310c_2$, $310d_1$, $310d_2$ and $310e$ metal guiding planes of the CMOS structure, which are for example schematically shown in FIG. 3. The exemplary embodiment of FIG. 5 is therefore based on an SOI CMOS technology with a buried oxide layer, which corresponds to the dielectric transparent layer 510 and is at the same time used as electrical insulator and light guide. Hence, despite an eventually complex integration of the electronic emitter-activating and photodetector-reading unit, a high insulation voltage is obtained. Both circuit parts are fully isolated from each other on a chip. In order to achieve an as high as possible absorption by the photodetector 515, the photodetector 515 should be selected accordingly large. An active layer, which has for example silicon and is provided on the dielectric transparent layer 510, should be implemented thick enough to achieve a high probability of photon absorption. For example, a layer thickness, which is in the range from about 200 nm to about 3 μm could be selected.

The structures designated in FIG. 5 by the reference numerals $310d_1$, $310d_2$, $310a_1$ and $310a_2$ can each be a portion of a first metal guiding plane (MET1) of a CMOS structure, the structures $310b$ and $310e$ can be portions of a second metal guiding plane (MET2), and the structure 190 can be a portion of a third metal guiding plane (MET3).

Figure 6:
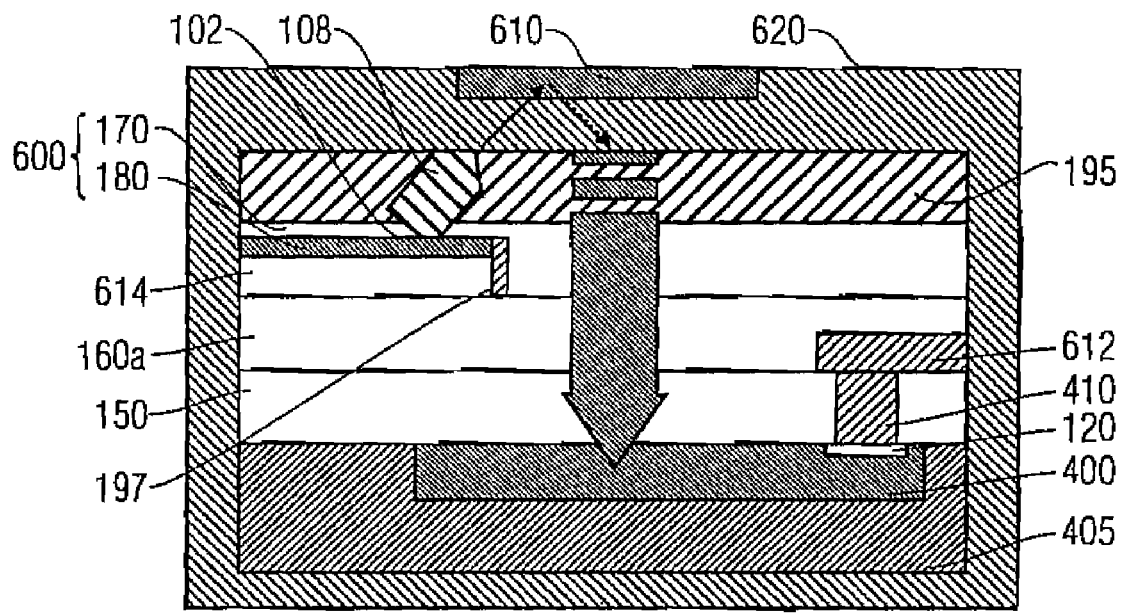
FIG. 6 shows an OLED as a top emitter radiating indirectly onto a photodetector.

FIG. 6 shows an exemplary embodiment in which an OLED 600 is used as top emitter, which radiates indirectly onto the photodetector 400. Like in the exemplary embodiment that has been explained in the context of FIG. 4, the photodetector 400 has the photodiode (which is formed by an existing p-n junction), which is connected through the contact 120 and is embedded in the p-type substrate 405. The contact 120 is connected through the bridge 410 with a metal guiding plane 612 of the CMOS structure. The metal guiding plane 612 is located in the IMD1 layer 160a, which follows the ILD layer 150.

The OLED 600 is applied on the IMD1 layer 160a, a metal guiding plane (MET2) formed on the IMD1 layer 160a serving as lower electrode 614, on which are applied the series of organic layers 180 and the transparent electrode 170. As a protection for the OLED as top emitter 600 follows finally the passivation layer 195, which has a transparent material. The side passivation 197 provides, here too, isolation between the transparent electrode 170 and the second electrode 190. The structures 612 and 614 serving for connecting can furthermore be, here too, inherent parts of the CMOS structure, be formed as metal guiding planes and in addition serve as shielding planes.

In addition, this exemplary embodiment has a reflector 610 on an inner wall of a casing 620. The reflector 610 is arranged so that a light signal 108 from the OLED 600, which serves as top emitter, is reflected on the photodetector 400, i.e. the light signal 108 is radiated toward the reflector 610, reflected by the latter and arrives in the photodiode 400, which is embedded in the p-type substrate 405. In this reflection arrangement, the OLED 600 thus radiates upward, i.e. toward the passivation layer 195. As can be seen in FIG. 6, in an embodiment, it should be made sure that the photodetector 400 is not covered by the shielding plane 310e, in order for an as large as possible portion of the reflected light signal 108 to reach the photodetector 400.

Figure 7:
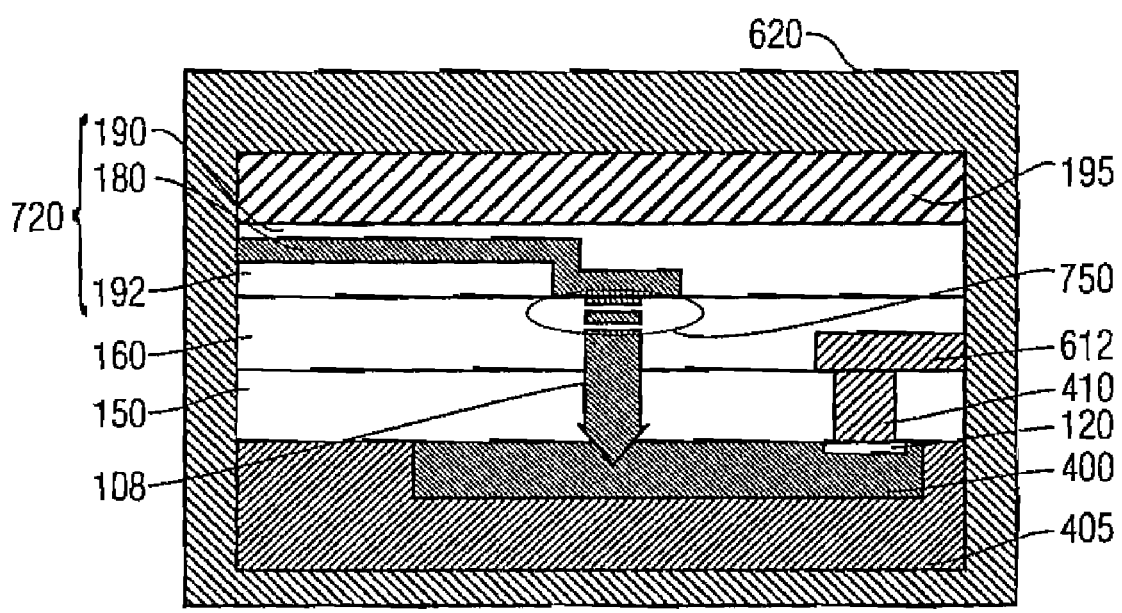
FIG. 7 shows an OLED as a micro-cavity OLED radiating indirectly onto a photodetector.
Figure 8:
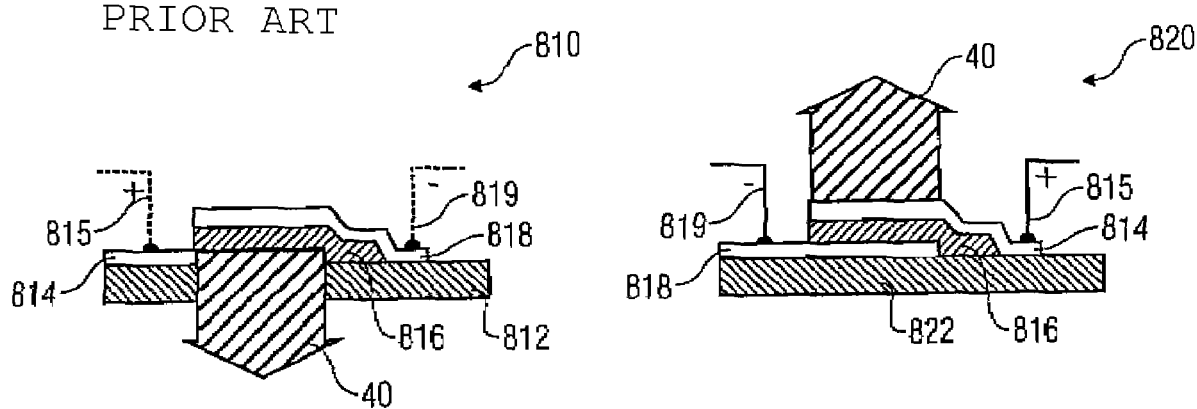
FIG. 8 shows an OLED as a bottom emitter and an OLED as a top emitter.

FIG. 7 shows another exemplary embodiment, which has an OLED with two opaque electrodes 190 and 192. The series of organic layers 180 is arranged between both opaque electrodes 190 and 192 and thus forms a so-called micro-cavity OLED 720. Both opaque electrodes 190 and 192 can be formed, for example, by two metal layers, which are deposited on the CMOS structure located under them. The photodetector corresponds to photodetector described with reference to the exemplary embodiment of FIG. 6.

The micro-cavity OLED 720 has an optical window 750, at which protrudes the series of organic layers 180 between the two opaque electrodes 190 and 192 and which serves as an exit area 750 for the light signal 108 and is so arranged that it is in optical contact with the photodetector 400. In addition, the micro-cavity OLED 720 is, here too, protected by a passivation layer 195 on the side opposite the optical window 750 and an outer casing 620 offers the advantage of a good shielding of the radiating micro-cavity OLED 720.

Since both electrodes 190 and 192 are opaque in this exemplary embodiment, light propagation can occur, after generation of the light signal 108 in the series of organic layers 180, only along the series of organic layers 180. Thus, the light signal 108 exits the micro-cavity OLED 720 through the optical window 750, passes through the IMD layer 160 and the ILD layer 150, before being converted in the photodiode 400 into an electrical output signal.

The exemplary embodiments of the present invention described with reference to the figures can obviously also be combined or extended. For example, the exemplary embodiment, which has been described in the context of FIG. 6, can be changed in that the optocoupler has also further or other reflectors or a focusing of the light signal 108 occurs through an optical unit. Thus, instead of the reflector 610 on the inner side of the casing, a reflector can be placed on the passivation layer 195 or added as an additional reflector. The reflector 610 can also be designed as a reflecting surface or can also be designed so that the reflector 610 focuses the light signal 108 on the photodetector 400. A focusing can for example be achieved in that the reflector 610 has an appropriate curvature or the optocoupler has a lens. A focusing reflector 610 or a lens would be advantageous in that the inlet area 55 of the photodetector 400 can be chosen accordingly smaller and nevertheless still receives a sufficient quantity of light.

The highest insulation voltage is achieved in the exemplary embodiment of FIG. 5, since the organic light emitter 100 with its electronic activation unit is completely electrically isolated from the photodetector 400 and the isolation voltage can be adjusted through a layer thickness of the transparent layer 510 (buried layer) selected accordingly as well as through a side distance. In the exemplary embodiments of the remaining figures, the isolation voltage can be increased in that the electronic activation unit of the organic light emitters 100, 600 or 720 and the photodetector 400 are arranged in different substrate areas that are, in addition, isolated from each other, such as for example by means of trenches. The electronic activation unit can for example also be arranged in lower substrate areas.

The optocoupler can transmit in operation both analogue and digitized signals. In order to be able to effectively suppress external parasitic effects or extraneous light influences, it can be advantageous to use a fixed timing or a modulation. Since OLEDs are available for a plurality of frequencies, a multi-channel solution can be achieved with a combination of various OLEDs (e.g. by depositing several OLEDs on a CMOS structure). Suitable activation circuits for adequately modulating the light source, i.e. the OLED, can be provided.

The described exemplary embodiments of optocouplers with integrated OLED offer the advantages already mentioned above. These advantages include in particular a reduction of the complexity of the construction and connection technique (CCT) for the integration and the costs. In addition, the monolithic integration of light source, electrical isolator, light guide and photodetector on one chip is easy to carry out. Furthermore, standard CMOS layers/structures can be used as electrical isolator and light guide. This results in an improvement of the isolation strength when using an SOI-CMOS substrate as well as a reduction of the chip area. Finally, the exemplary embodiments of the present invention provide the possibility of a complex integration of an activation circuit for the light emitter and an electronic reading unit for the photodetector. Thus, a high isolation voltage is achieved, despite an eventually complex integration of the electronic emitter-activation and photodetector-reading unit. Both circuit parts are completely isolated from each other on one chip and the isolation voltage reached can be flexibly adjusted through an appropriate selection of the layer thicknesses or the layer materials.

To conclude, different aspects of the present invention can thus be presented as follows:

spatial co-integration of organic emitter and CMOS photodetector on a CMOS silicon chip in an arrangement as optocoupler;

using CMOS p-n junctions (e.g. well-substrate, well-contact, and the like) as photodetectors;

arrangement of the OLED emitter as a bottom emitter radiating directly onto the photodetector;

arrangement of the OLED emitter as a bottom emitter radiating indirectly onto the photodetector;

arrangement of the OLED emitter as a top emitter radiating indirectly, i.e. using a reflector, onto the photodetector;

arrangement of the OLED emitter as a top emitter radiating indirectly onto the photodetector, a reflection occurring at the passivation surface;

arrangement of the OLED emitter as a top emitter radiating indirectly onto the photodetector, an additional reflector being placed on the inner side of the casing;

arrangement of the OLED emitter as an OLED with two opaque electrodes radiating indirectly onto the photodetector, and;

using an SOI-CMOS substrate for an improved electrical isolation of the activation and reading circuit and using an SOI layer as light guide;

using the metallization planes of the CMOS structure in order to guarantee a light guiding to the detector;

modulation of the light source for the galvanic separated signal transmission; and monolithic implementation in complex integrated circuits for—eventually multi-channel—galvanic uncoupling of switching blocks, e.g. for parasitic uncoupling, noise reduction or the like.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. An optocoupler comprising:
   an organic light emitter, and
   an inorganic photodetector comprising a detector area, the detector area being optically coupled with the organic light emitter,
   one or several shielding planes arranged above each other and separated by isolating layers arranged substantially parallel to a light-emitting surface of the organic light emitter, the shielding planes between the photodetector and the organic light emitter;
   the organic light emitter converting an electrical input signal into a light signal and the inorganic photodetector converting the light signal into an electrical output signal, and the organic light emitter and the inorganic photodetector being integrated in a component, wherein the shielding planes cause a light shielding and a focusing of the light signal and are electrically isolated from the light-emitting surface.

2. The optocoupler according to claim 1, wherein the inorganic photodetector comprises a doped semiconductor material with at least one p-n junction.

3. The optocoupler according to claim 1, wherein the organic light emitter comprises an organic light-emitting diode.

4. The optocoupler according to claim 1, wherein the organic light emitter and the inorganic photodetector are arranged at two opposite sides of one or several isolation layers.

5. The optocoupler according to claim 1, comprising furthermore a deflection layer which is formed so that a direction of propagation of the light signal is changed by the organic light emitter using the deflection layer.

6. The optocoupler according to claim 1, comprising furthermore a reflector and wherein the organic light emitter is arranged so that it emits the light signal toward the reflector and the inorganic photodetector is arranged so as to receive the light signal from the reflector.

7. The optocoupler according to claim 6, wherein the organic light emitter comprises furthermore a passivation layer with a surface on the side opposite the inorganic photodetector and the reflector is deposited on the surface.

8. The optocoupler according to claim 6, comprising furthermore a casing and wherein the reflector is applied on an inner side of the casing.

9. The optocoupler according to claim 1, wherein the organic light emitter comprises two opaque electrodes and an organic intermediate layer, the opaque electrodes being separated by the organic intermediate layer and the organic intermediate layer forming an optical output, so that the light signal generated in the organic intermediate layer exits the organic intermediate layer at the optical output and the optical output is optically coupled with the detector area of the inorganic photodetector.

10. The optocoupler according to claim 1, comprising furthermore a series of dielectric transparent layers with at least one layer and/or, which are arranged between the organic light emitter and the detector area, in the at least one layer and/or being placed, furthermore, at least parts of an electronic activation unit for the organic light emitter and/or the inorganic photodetector and/or a reading circuit.

11. The optocoupler according to claim 10, wherein the deflection layer comprises a buried oxide layer and the deflection layer is formed as a light guide for the light signal, so that the light signal is transmitted, after having passed through the series of dielectric transparent layers, through the deflection layer to the detector area of the inorganic photodetector.

12. The optocoupler according to claim 1, comprising an electronic activation unit controlling the organic light emitter so that the light signal comprises a modulation, in order to suppress possible extraneous light influences.

13. The optocoupler according to claim 1, wherein components of the inorganic photodetector and/or components for operating the organic light emitter are implemented in CMOS, BiCMOS or bipolar technology.

14. The optocoupler according to claim 1, wherein an electronic activation unit for the organic light emitter and the inorganic photodetector are arranged in different substrate areas.

15. The optocoupler according to claim 14, wherein the different substrate areas are isolated from each other by trenches.

16. The optocoupler according to claim 14, wherein the different substrate areas are areas of an SOI substrate isolated from each other.

* * * * *